United States Patent
Arita et al.

(10) Patent No.: US 7,906,410 B2
(45) Date of Patent: Mar. 15, 2011

(54) METHOD OF MANUFACTURING SEMICONDUCTOR CHIP USING LASER LIGHT AND PLASMA DICING

(75) Inventors: Kiyoshi Arita, Fukuoka (JP); Atsushi Harikai, Saga (JP)

(73) Assignee: Panasonic Corporation, Osaka (JP)

( * ) Notice: Subject to any disclaimer, the term of this patent is extended or adjusted under 35 U.S.C. 154(b) by 351 days.

(21) Appl. No.: 12/160,482

(22) PCT Filed: Feb. 7, 2008

(86) PCT No.: PCT/JP2008/000171
§ 371 (c)(1),
(2), (4) Date: Jul. 10, 2008

(87) PCT Pub. No.: WO2008/096542
PCT Pub. Date: Aug. 14, 2008

(65) Prior Publication Data
US 2010/0173474 A1    Jul. 8, 2010

(30) Foreign Application Priority Data

Feb. 8, 2007    (JP) ................................ 2007-028933

(51) Int. Cl.
*H01L 21/00* (2006.01)
(52) U.S. Cl. ........................................ 438/462; 438/460
(58) Field of Classification Search .................. 438/460, 438/462
See application file for complete search history.

(56) References Cited

U.S. PATENT DOCUMENTS

| | | | | |
|---|---|---|---|---|
| 6,642,127 B2* | 11/2003 | Kumar et al. | ................. | 438/460 |
| 7,183,137 B2* | 2/2007 | Lee et al. | ..................... | 438/114 |
| 2006/0009008 A1* | 1/2006 | Kaneuchi et al. | ............. | 438/463 |
| 2006/0205182 A1* | 9/2006 | Soejima | ....................... | 438/460 |

FOREIGN PATENT DOCUMENTS

| | | |
|---|---|---|
| JP | 2001-250800 | 9/2001 |
| JP | 2005-191039 | 7/2005 |
| JP | 2006-075725 | 7/2006 |
| JP | 2006-179768 | 7/2006 |
| JP | 2008-023489 | 2/2008 |

OTHER PUBLICATIONS

International Search Report Dated May 7, 2008.

* cited by examiner

*Primary Examiner* — N Drew Richards
*Assistant Examiner* — Michael Jung
(74) *Attorney, Agent, or Firm* — Pearne & Gordon LLP

(57) ABSTRACT

In a method in which a semiconductor wafer 1 having integrated circuits 3 formed in a plurality of chip regions and test patterns 4 formed in scribe lines 2a is divided by a plasma etching process so as to manufacture individual semiconductor chips, in the semiconductor wafer 1, a protection sheet 5 which constitutes a mask in the plasma etching process is adhered onto a front plane 1a thereof where the integrated circuits 3 have been formed; since laser light 9a is irradiated along the scribe lines 2a, only a predetermined width of the protection sheet 5 is removed so as to form a mask having a plasma dicing-purpose opening portion 5b; and also, the test patterns 4 are removed by the laser light 9a in combination with a front plane layer of the semiconductor wafer 1. As a result, the test patterns 4 can be removed in a higher efficiency and in simple steps, while the general purpose characteristic can be secured.

4 Claims, 11 Drawing Sheets

METHOD OF MANUFACTURING SEMICONDUCTOR CHIP USING LASER LIGHT AND PLASMA DICING

TECHNICAL FIELD

The present invention is related to a semiconductor chip manufacturing method for manufacturing semiconductor chips by dividing a semiconductor wafer on which test patterns have been formed on scribe lines with respect to each of integrated circuits.

BACKGROUND ART

Semiconductor chips are manufactured in such a manner that after a plurality of integrated circuits have been formed in a batch mode under semiconductor wafer condition, the semiconductor wafer is cut along scribe lines so as to be divided with respect to each of the integrated circuits. While several wafer cutting methods is conventionally employed, for instance, such a wafer cutting method is known that the wafer is mechanically cut by rotary blades (refer to, for example, patent publication 1); and instead of the mechanical cutting method, another wafer cutting method is known as a method based upon a plasma dicing process in that portions of the wafer which correspond to scribe lines are removed by a plasma etching process so as to divide the wafer (refer to, for example, patent publication 2), and the like.

On the other hand, in stages for manufacturing semiconductor chips, when circuit patterns are formed, test patterns employed in characteristic tests are formed on regions corresponding to the scribe lines; and after functions of these test patterns have been accomplished, these test patterns are cut off, or removed during dicing process. In the example shown in the patent publication 1, prior to the dicing process for cutting the wafer itself, the test patterns have been previously removed by employing the rotary blade having the wider width. As a result, since the entire portion of the test patterns are removed, it is possible to avoid "burrs" of cut planes, which occur when the test patterns are partially cut.

Then, another method indicated in a patent publication 3 has been proposed as to removing of the test patterns in such a case that the plasma dicing process is applied. That is, in this example, a protection sheet is adhered to a circuit forming plane of a semiconductor wafer in such a manner that the protection sheet is contacted to test patterns; subsequently, a plasma etching-purpose mask is formed on a rear plane of the circuit forming plane, and the wafer is cut by a plasma etching process; and then, such a test pattern which has not been removed in the plasma etching process but has been left is released in combination with the protection sheet, and thus, is removed. As a consequence, after the plasma etching process, the side of the circuit forming plane is no longer plasma-ashed in order to remove the mask, and therefore, damages of the circuit forming plane caused by the plasma ashing process can be eliminated.

[Patent Publication 1] JP-A-2001-250800
[Patent Publication 2] JP-A-2005-191039
[Patent Publication 3] JP-A-2006-179768

Moreover, the conventional technical ideas described in the above-explained patent publications contain the following difficult points: That is, in the conventional example disclosed in the patent publication 1, since the cutting works by employing two sorts of the rotary blades are required in the dicing step, a total number of the processing steps is increased, so that the improvement in the productivity is impeded. Also, in the example disclosed in the patent publication 3, while the step for performing the plasma etching process from the side of the rear plane of the wafer is made complex, in such a case that the sizes of the test patterns are large and the test patterns have been formed in such a form that the semiconductor chips located adjacent to each other on the scribe lines are coupled to each other without any gap, the test patterns cannot be removed by performing only such a plasma etching process with employment of the process gas of the fluorine series. As a result, there is such a difficult point as to the general-purpose characteristic that the subject to be removable is limited. As previously explained, in the conventional semiconductor chip manufacturing methods, there is the below-mentioned problem: That is, while the general-purpose characteristic is secured, the test patterns in the dicing step can be hardly removed in a higher efficiency and in simple steps.

DISCLOSURE OF INVENTION

As a consequence, the present invention has an object to provide a semiconductor chip manufacturing method capable of removing test patterns in a higher efficiency in simple steps, while a general-purpose characteristic can be secured.

A semiconductor chip manufacturing method, according to an aspect of the present invention, is featured by such a semiconductor chip manufacturing method in which a semiconductor chip containing a plurality of integrated circuits formed in a plurality of regions segmented by a plurality of scribe lines and containing a plurality of test patterns formed in the scribe lines is divided by a plasma etching process so as to manufacture individual semiconductor chips with respect to each of the integrated circuits, and in which the semiconductor chip manufacturing method is comprised of: a sheet adhering step for adhering a protection sheet which constitutes a mask in the plasma etching process onto a front plane of the semiconductor wafer, on which the integrated circuits have been formed, and further, for adhering a holding sheet onto a rear plane of the semiconductor wafer, the holding sheet being employed so as to hold the individual semiconductor chips under divided condition; a test pattern removing step in which since laser light is irradiated from the side of the protection sheet along the scribe lines with respect to the semiconductor wafer on which the protection sheet has been adhered, only a predetermined width of the protection sheet on the scribe lines is removed so as to form the mask, and also, the test patterns are removed in combination with a front plane layer of the semiconductor wafer; a plasma dicing step in which since a portion within the semiconductor wafer, which corresponds to the removed protection sheet having the predetermined width, is plasma-etched after the test pattern removing step, a damaged layer produced by irradiating the laser light is removed, and also, the semiconductor wafer is divided with respect to each of said individual integrated circuits; and a protection sheet removing step for removing the protection sheet from the front plane of the semiconductor wafer after the plasma dicing step.

In accordance with the present invention, the protection sheet which constitutes the mask in the plasma etching process is adhered onto the front plane of the semiconductor wafer, on which the integrated circuits have been formed; since the laser light is irradiated from the side of the protection sheet along the scribe lines of the semiconductor wafer on which the protection sheet has been adhered, only the predetermined widths of the protection sheet on the scribe lines are removed so as to form the mask; and also, the test patterns are removed in combination with the front plane layer of the semiconductor wafer by the above-described laser light. As a result, the test patterns can be removed in the higher efficiency in the simple steps, while the general-purpose characteristic can be secured.

BEST MODE FOR CARRIED OUT THE INVENTION

Next, a description is made of embodiment modes of the present invention with reference to drawings.

Figure 1:
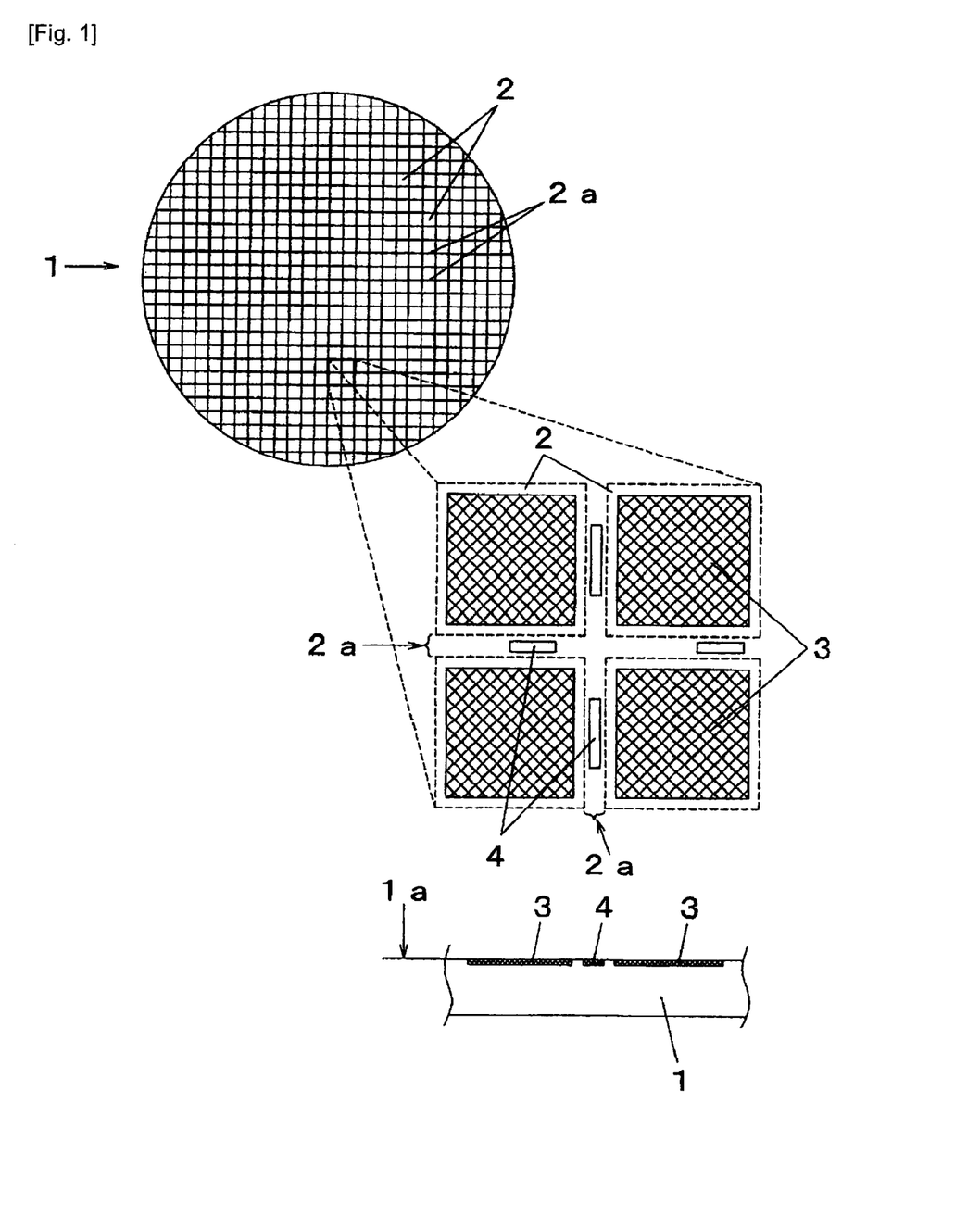
FIG. 1 is a detailed explanatory diagram of a semiconductor wafer which is employed in a semiconductor chip manufacturing method according to an embodiment mode of the present invention.

A first description is made of a semiconductor wafer 1 with reference to FIG. 1, which is employed in a semiconductor chips manufacturing method according to the present embodiment mode of the present invention. In FIG. 1, the semiconductor wafer 1 has been segmented into a plurality of chip regions 2 (areas) having rectangular shapes by employing scribe lines 2a arrayed in a lattice shape so as to cut off respective semiconductor chips from each other. On a front plane 1a corresponding to a circuit forming plane of the semiconductor wafer 1, each of integrated circuits 3 has been formed in each of the chip regions 2, and test patterns 4 have been formed in the scribe lines 2a. The test patterns 4 are employed for characteristic tests and the like in manufacturing steps of semiconductor chips, and are removed after the function of the test patterns 4 has been accomplished. In the semiconductor chip manufacturing method shown in the present embodiment mode, the semiconductor wafer 1 is divided by a plasma dicing process with employment of a plasma etching process with respect to each of these integrated circuit 3 so as to manufacture individual semiconductor chips.

Figure 2:
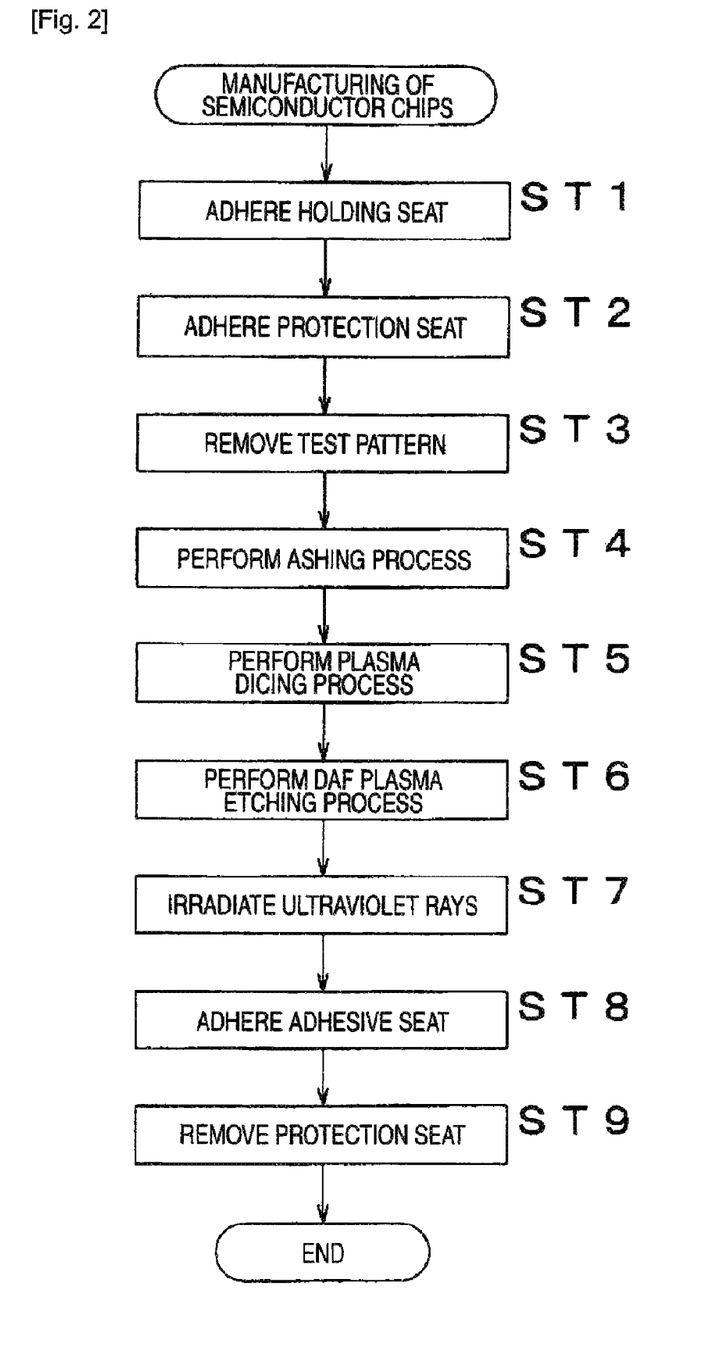
FIG. 2 is a flow chart for describing the semiconductor chip manufacturing method according to the embodiment mode of the present invention.
Figure 3A:
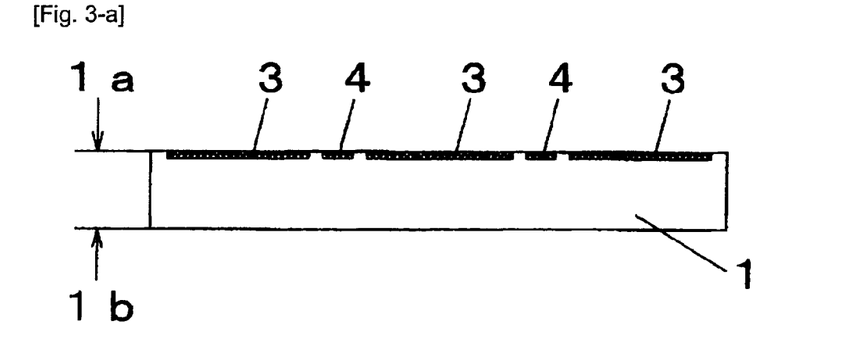
FIGS. 3(a) to 3(d) are explanatory diagrams for explaining steps of the semiconductor chip manufacturing method according to the embodiment mode of the present invention.

Next, a description is made of detailed steps of the semiconductor chip manufacturing method in accordance with a flow chart shown in FIG. 2 with reference to respective drawings. In FIG. 2, first of all, while the semiconductor wafer 1 is employed as a subject in which both the integrated circuits 3 and the test patterns 4 have been formed on the front plane 1a thereof (refer to FIG. 3(a)), a holding sheet adhering operation (step ST1) and a protection sheet adhering operation (step ST2) are carried out. It should be understood that any one of the above-described holding sheet adhering operation (step ST1) and protection sheet adhering operation (step ST2) may be alternatively executed at first.

Figure 3B:
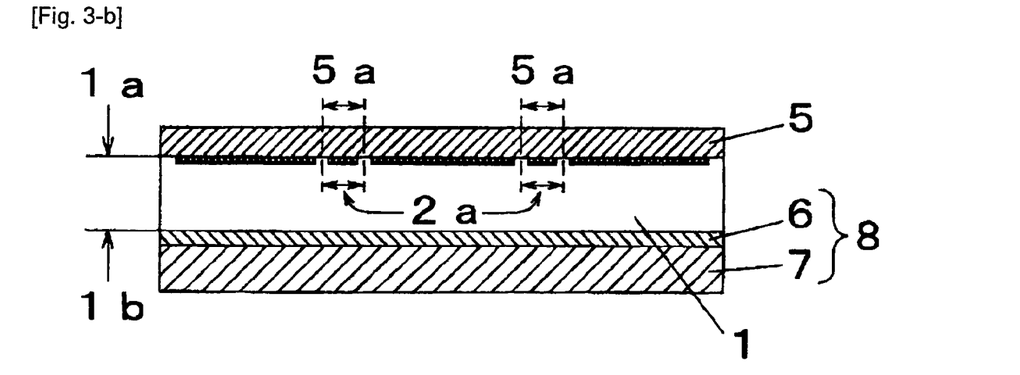

In other words, as shown in FIG. 3(b), a holding sheet 8 is adhered on a rear plane 1b of the semiconductor wafer 1, which is located on the opposite side of the front plane 1a. The holding sheet 8 is employed in order to hold semiconductor chips of the semiconductor wafer 1 under such a condition that the semiconductor wafer 1 has been divided into the individual semiconductor chips. The holding sheet 8 has been constructed by stacking a die attach film 6 on a resin sheet 7, while the die attach film 6 functions as an adhesive layer which is employed so as to adhere the semiconductor chips in a die bonding step of succeeding steps. When this holding sheet 8 is adhered, the die attach film 6 is contacted to the rear plane 1b. In this case, an UV (ultraviolet) tape is designed to be employed as the resin sheet 7, while the UV tape has been provided with an adhesive layer whose adhesive force is lowered by being irradiated by ultraviolet rays. In the die bonding step of the succeeding steps, the ultraviolet rays are irradiated from the lower plane side of the UV tape in the die bonding step of the succeeding steps, so that the individual semiconductor chips can be easily derived.

Also, the protection film 5 for protecting the circuit forming plane is adhered to the front plane 1a. In this case, as the protection sheet 5, such a UV tape is used, while the UV tape is a resin sheet having an adhesive layer whose adhesive force is lowered by receiving light. As will be discussed later, in the present embodiment mode, as to the protection sheet 5 adhered onto the semiconductor wafer 1, a range equivalent to the scribe lines 2a is removed, and the remaining protection sheet is caused to function as a mask in a plasma etching process for dividing the semiconductor wafer 1 into the individual semiconductor chips.

That is to say, in the steps ST1 and ST2, as to the semiconductor wafer 1, the protection sheet 5 which functions as the mask in the plasma etching process is adhered onto the front plane 1a thereof where the integrated circuit 3 have been formed, and furthermore, the holding sheet 8 for holding the semiconductor chips under such a condition that these semiconductor chips have been individually divided is adhered to the rear plane 1b (sheet adhering step). Then, in this case, the resin sheet 7 provided with the die attach film 6 is employed as the holding sheet 8. In the sheet adhering step, while the die attach film 6 is contacted to the rear plane 1b of the semiconductor wafer 1, the holding sheet 8 is adhered to this rear plane 1b.

Next, the test patterns 4 are removed (step ST3). In this case, while a laser working apparatus 10 indicated in FIG. 4 is employed, the protection sheet 5 is removed along the scribe lines 2a by laser light emitted from the laser working apparatus 10, and the test patterns 4 are removed at the same time when a mask forming process operation is carried out by which the mask in the above-described plasma etching process is formed.

Figure 4:
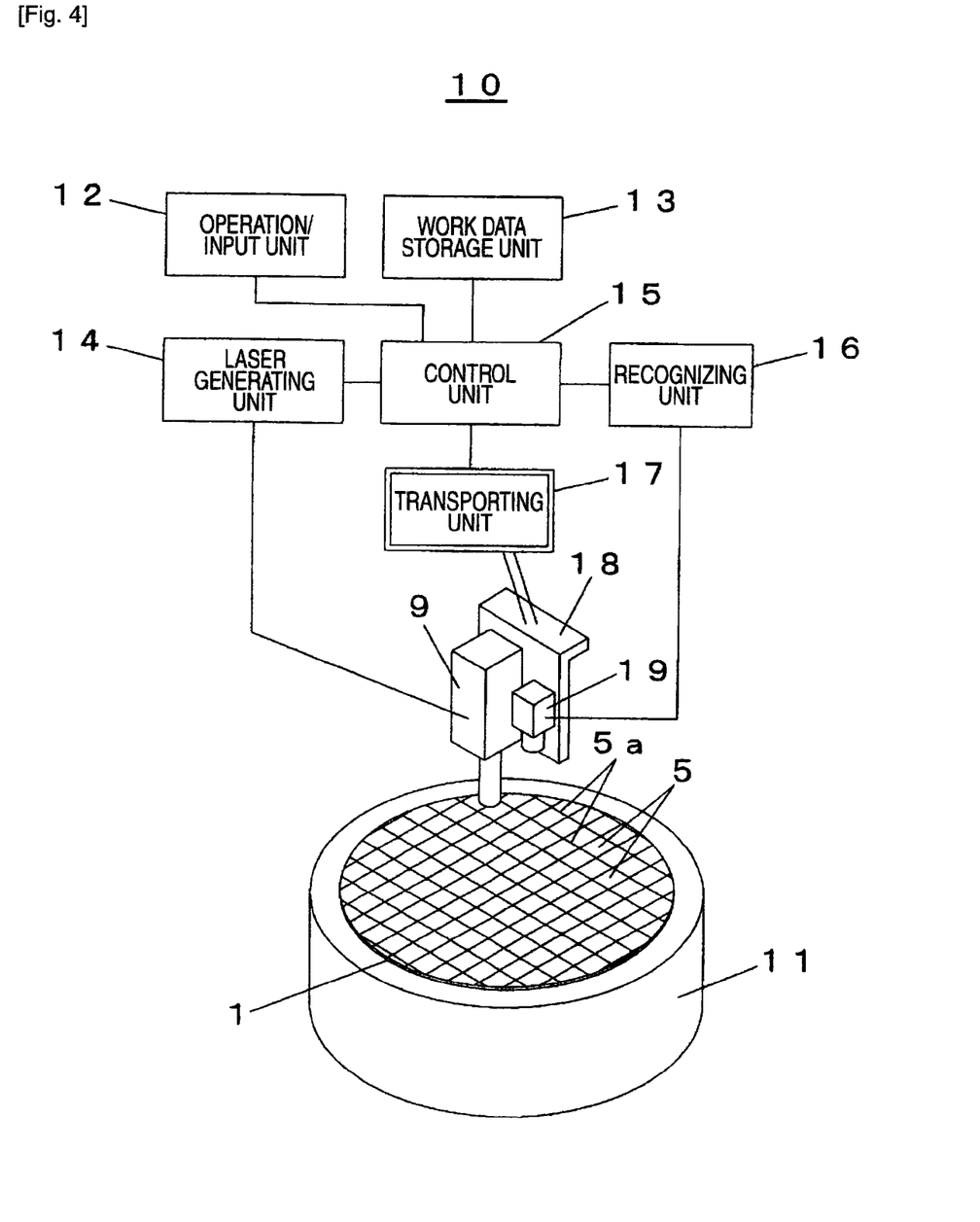
FIG. 4 is a perspective view for representing a laser working apparatus which is used in the semiconductor chip manufacturing method according to the embodiment mode of the present invention.

Referring now to FIG. 4, a description is made of a construction of the laser working apparatus 10. In FIG. 4, the semiconductor wafer 1 where the protection sheet 5 has been adhered on the front plane 1a thereof has been held on a wafer holding unit 11. Above the wafer holding unit 11, a transport plate 18 on which both a laser irradiating unit 9 and a camera 19 have been mounted has been arranged in a freely transporting manner by a transporting mechanism 17. The laser irradiating unit 9 irradiate laser light 9a generated by a laser generating unit 14 with respect to the semiconductor wafer 1 located under the laser irradiating unit 9.

The camera 19 is an infrared camera, and images the semiconductor wafer 1 located under the camera 19 by employing infrared rays. At this time, the camera 1 can image the integrated circuits 3, recognition marks, and the like of the semiconductor wafer 1 by seeing through the protection sheet 5. Then, imaged results are recognizing-processed by a recognizing unit 16, so that array positions of the integrated circuits 3 and the scribe lines 2a within the semiconductor wafer 1 can be detected.

The laser generating unit 14, the recognizing unit 16, and the transporting mechanism 17 are controlled by a control unit 15. When the control unit 15 controls these respective structural units in response to an operation instruction entered from an operation/input unit 12, the control unit 15 refers to data stored in a work data storage unit 13. Data related to the array positions of the scribe lines 2a, and also, data related to dicing widths corresponding to widths of the scribe lines 2a have been stored in the work data storage unit 13. As represented in FIG. 3(b), the dicing widths are coincident with regions which correspond to the scribe lines 2a in the semiconductor wafer 1 on the protection sheet 5, namely, are coincident with widths of boundary line regions. A data writing operation with respect to the work data storage unit 13 may be carried out by the operation/input unit 12.

When the above-described laser working apparatus 10 performs a laser working operation while the semiconductor wafer 1 is employed as a working subject, the control unit 15 controls the transporting mechanism 17 based upon an actual position of the semiconductor wafer 1 detected by the recognizing unit 16, and the data indicative of the positions of the scribe lines 2a, which have been stored in the work data storage unit 13. As a result, the transporting mechanism 17 transports the laser irradiating unit 9 along the scribe lines 2a over the upper plane of the semiconductor wafer 1. Then, since the control unit 15 controls the laser generating unit 14 based upon the data related to the dicing widths, laser light 9a is irradiated from the laser irradiating unit 9, while output power of the laser light 9a is properly selected so as to remove the boundary line regions 5a of the protection sheet 5, whose removed widths correspond to the dicing widths. Then, since the above-described laser working operation is carried out, only the boundary line regions 5a are removed from the protection sheet 5 formed on the front plane 1a of the semiconductor wafer 1, so that a plasma dicing-purpose mask pattern is formed in which opening portions 5b having grooves have been formed. The removed boundary line regions 5a correspond to the scribe lines 2a used to cut off the semiconductor chips form each other.

Figure 3C:
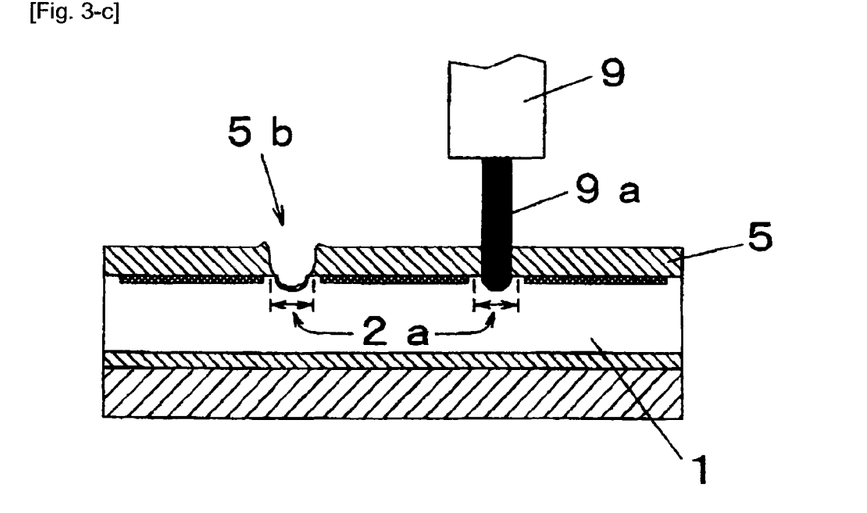
Figure 3D:
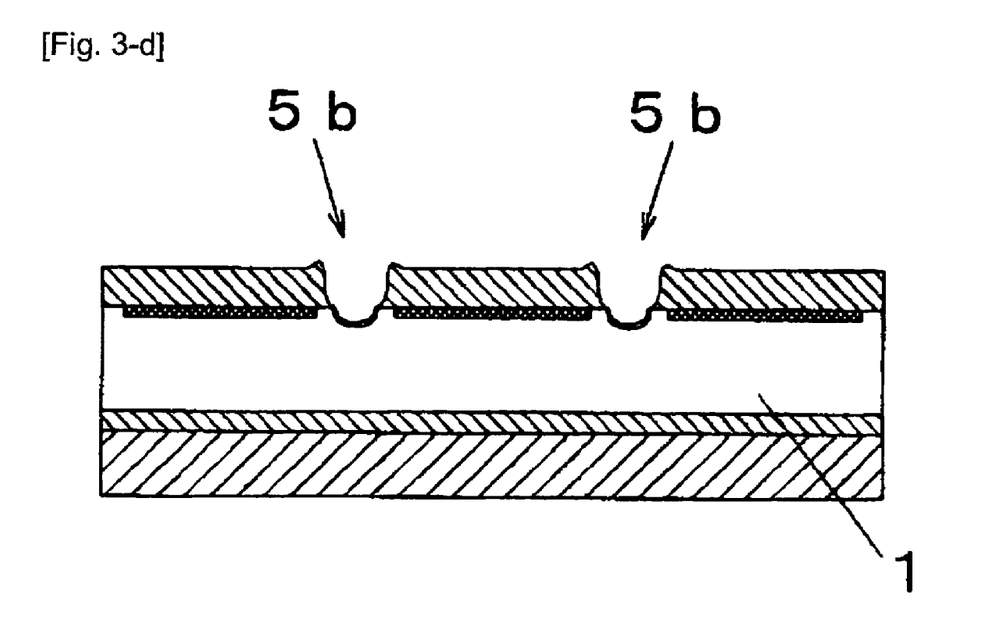

When the laser working operation is performed with respect to the semiconductor wafer 1, the laser light 9a is irradiated from the laser irradiating unit 9 provided in the laser working apparatus 10 and as shown in FIG. 3(c), the laser irradiating unit 9 is transported along the scribe lines 2a on the semiconductor wafer 1. As a result, as represented in FIG. 3(d), the boundary line regions 5a are removed by the laser light 9a irradiated from the laser irradiating unit 9 so as to form the opening portions 5b which penetrate through the protection film 5, and further, the test patterns 4 formed on the front plane 1a of the semiconductor wafer 1 are removed by the laser light 9a.

In other words, in the above-described test pattern removing step (ST3), since the laser light 9a is irradiated from the side of the protection sheet 5 along the scribe lines 2a of the semiconductor wafer 1 on which the protection sheet 5 has been adhered, only the predetermined widths of the protection sheet 5 formed on the scribe lines 2a are removed so as to form the plasma dicing-purpose mask, and also, the test patterns 4 are removed in combination with the front plane layers of the semiconductor wafer 1 (test pattern removing step ST3), while the test patterns 4 have been formed at the positions corresponding to the scribe lines 2a on the semiconductor wafer 1. The above-described predetermined widths correspond to the above-explained dicing widths.

Figure 5:
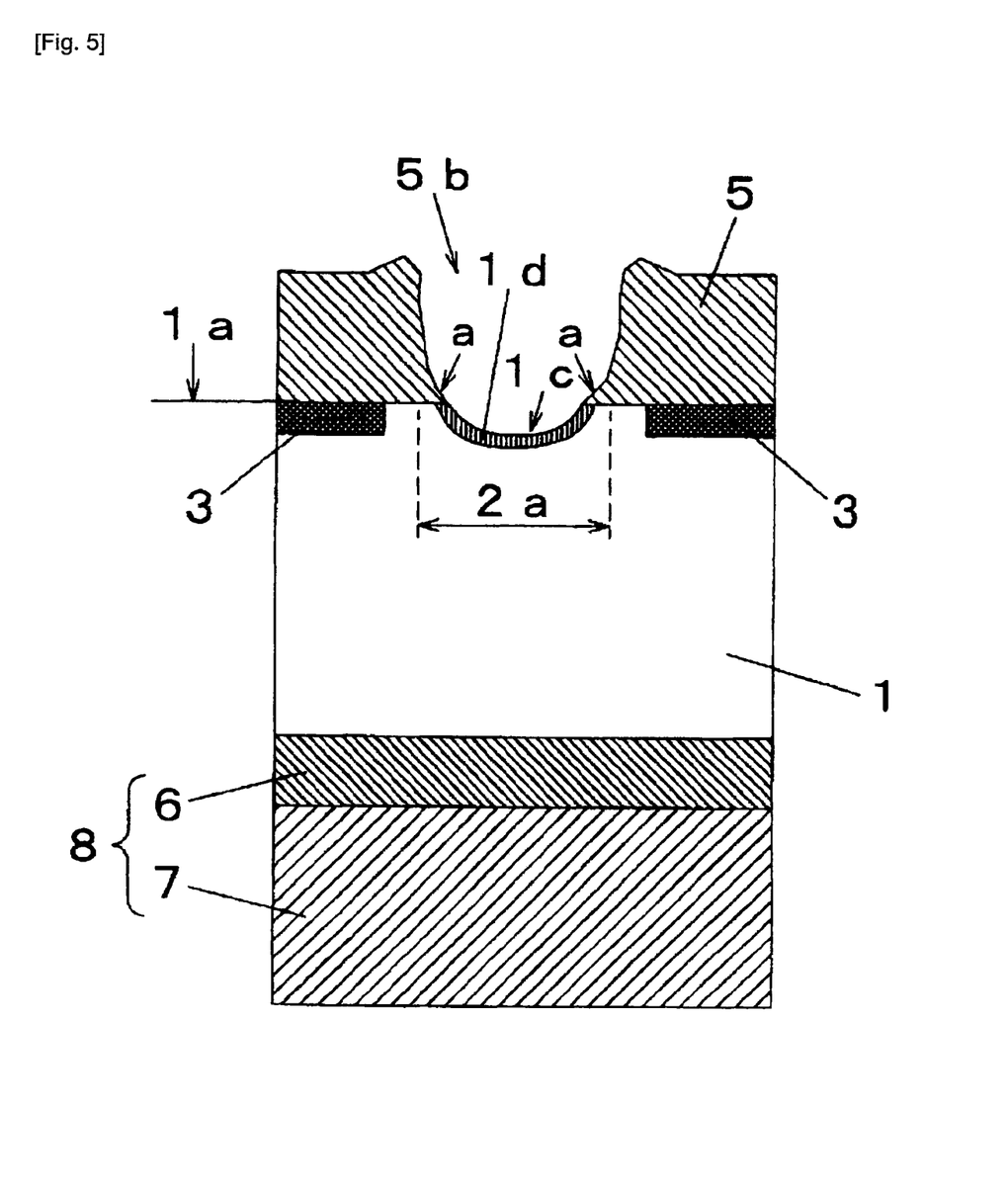
FIG. 5 is a partial sectional view for showing a semiconductor wafer in the semiconductor chip manufacturing method according to the embodiment mode of the present invention.

FIG. 5 illustratively shows an opening portion 5b in detail after this test pattern removing step ST3. In a laser working operation, a resin portion of a boundary line region 5a corresponding to a scribe line 2a in a protection sheet 5 is removed by the laser light 9a, so that the above-described opening portion 5b is formed. Then, a bottom portion of the opening portion 5b has reached up to a lower plane of the protection sheet 5, and thereafter, the effect of the laser light 9a may be given to the front plane 1a of the semiconductor wafer 1. As a result, the test pattern 4 which has been present at the position of the scribe line 2a on the front plane 1a is removed in combination with the front plane layer of the semiconductor wafer 1, and the effect of the laser light 9a may be furthermore given to an internal portion of the semiconductor wafer 1. At this time, a damaged layer 1d containing very small cracks is formed on a surface of a concave portion 1c which has been formed by removing the front plane layer of the semiconductor wafer 1 by the laser light 9a.

If the damaged layer 1d is left, then strengths of the semiconductor wafer 1 are lowered. Accordingly, this damaged layer 1d must be removed. In the present embodiment mode, in such a plasma dicing step that the semiconductor wafer 1 is divided by performing a plasma etching process, the damaged layer 1d is tried to be removed at the same time when the plasma etching process is performed. At this time, in such a case that the formed range of the damaged layer 1d is extended over the opening range of the bottom portion of the opening portion 5b, the damaged layer 1d is brought into such a condition that this damaged layer 1d is partially covered by the lower plane of the protection sheet 5 (refer to arrow "a" indicated in FIG. 5). Under such a condition, the effect of the plasma etching process cannot be given to the portion of this damaged layer 1d which is covered by the lower plane of the protection sheet 5, but even after the semiconductor wafer 1 has been divided into the individual semiconductor chips by the plasma dicing process, there are some possibilities that the damaged layer 1d may be partially left.

As a consequence, such a process operation capable of completely removing the above-described harmful damaged layer 1d in the plasma dicing process is carried out (step ST4). Namely, a so-called "ashing" process is carried out in order that an opening width of the opening portion 5b of the protection sheet 5 is enlarged by a plasma etching process so as to expose the entire portion of the damaged layer 1d to the bottom portion of the opening portion 5b. This ashing process is executed by performing a preliminary plasma etching process for enlarging the opening width of the opening portion 5b of the protection sheet 5 removed by the laser light 9a prior to an execution of a plasma dicing step ST5.

Subsequently, a plasma dicing process is carried out. That is, after the test pattern removing step ST3, such a portion of the semiconductor wafer 1 from which the protection sheet 5 has been removed is etched by a plasma etching process, while the above-described portion corresponds to the dicing width (namely, predetermined width), so that the damaged layer 1d produced by irradiating the laser light 9a is removed, and also, the semiconductor wafer 1 is divided with respect to each of these integrated circuits 3 (plasma dicing step ST5).

Figure 6:
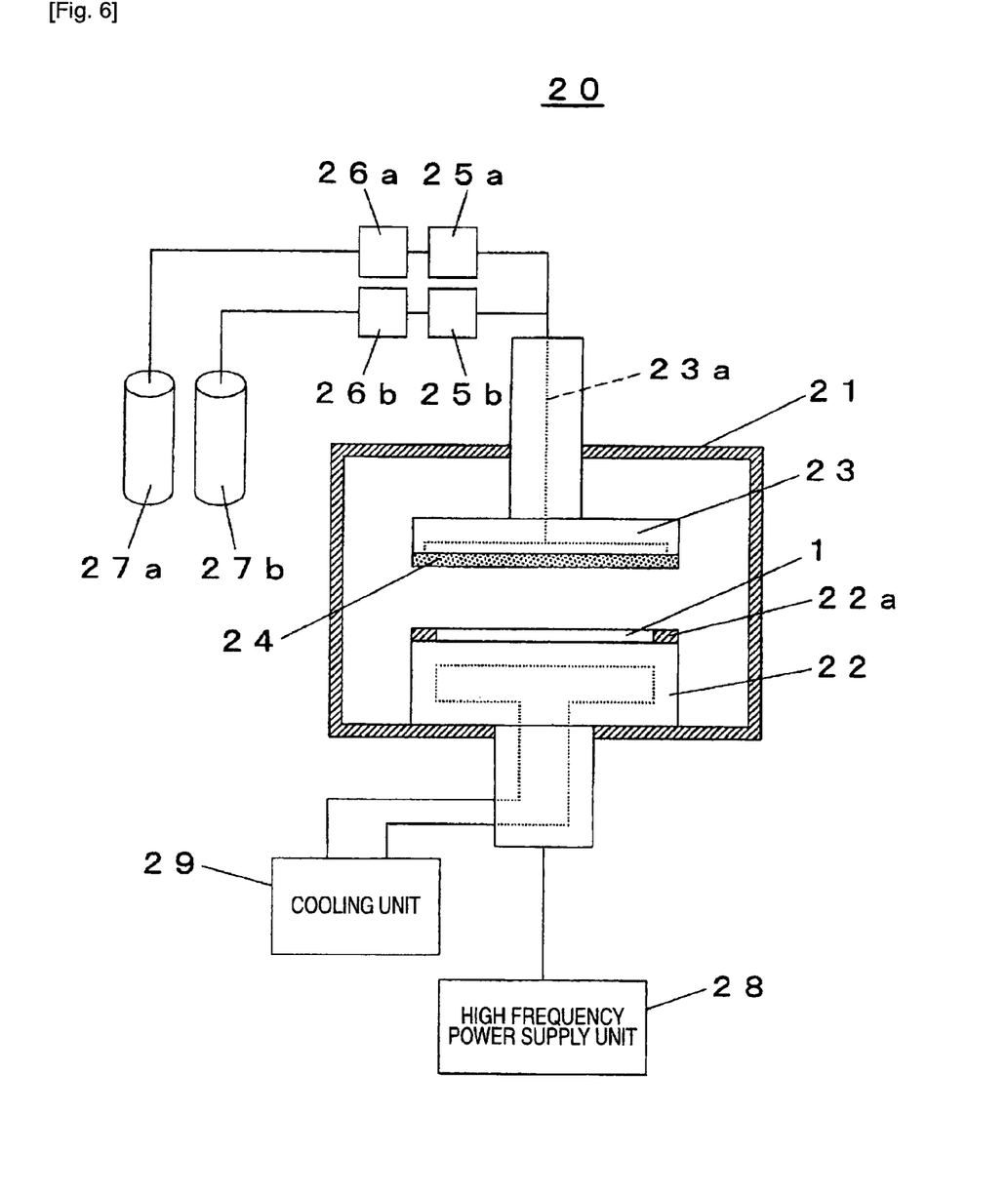
FIG. 6 is a sectional view for showing a plasma processing apparatus which is used in the semiconductor chip manufacturing method according to the embodiment mode of the present invention.

Next, a description is made of the plasma processing apparatus 20 which is used in the above-described preliminary plasma etching process and the plasma dicing process with reference to FIG. 6. In FIG. 6, an inner space of a vacuum chamber 21 has constituted a processing space which has been tightly sealed so as to perform a plasma processing operation with respect to the semiconductor wafer 1. Within the internal space of the vacuum chamber 21, a high frequency-sided electrode 22 and a gas supplying electrode 23 have been arranged in an opposite positioning manner. The semiconductor wafer 1 functioning as a subject to be processed is mounted on the high frequency-sided electrode 22 under such a condition that a peripheral portion of the semiconductor wafer 1 is surrounded by an insulating ring 22a, and the mounted semiconductor wafer 1 is held thereon by a vacuum suction manner, or an electrostatic suction manner.

A plasma generating-purpose gas supplying unit 27a and another plasma generating-purpose gas supplying unit 27b have been connected via opening/closing valves 25a, 25b, and flow rate control valves 26a, 26b to a gas supplying hole 23a formed in the gas supplying electrode 23, respectively. The plasma generating-purpose gas supplying unit 27a supplies either an oxygen gas or an oxygen mixture gas, which is employed in such a plasma processing operation for executing an ashing process having a purpose capable of removing the protection sheet 5 and the die attach film 6. The plasma generating-purpose gas supplying unit 27b supplies a plasma generating-purpose gas of fluorine series which is employed in a plasma dicing process having such a purpose that silicon (namely, major component) of the semiconductor wafer 1 is removed so as to form a dicing groove. Since the opening/closing valves 25a, 25b, and the flow rate control valves 26a, 26b are controlled, the sorts of plasma generating gases to be supplied to the gas supplying hole 23a can be selected, and the gas supply flow rates can be adjusted.

The supplied plasma generating-purpose gas is uniformly sprayed via a porous plate 24 mounted on a lower plane of the gas supplying electrode 23 with respect to the semiconductor wafer 1 mounted on the high frequency-sided electrode 21. Under the above-described condition, a high frequency power supply unit 28 is driven in order to apply a high frequency voltage. As a result, either plasma of the oxygen gas or plasma of the fluorine-series gas is generated between the gas supplying electrode 23 and the high frequency-sided electrode 22, so that a plasma processing operation for a purpose in each case is carried out by employing the generated plasma gas. In this plasma processing step, a cooling unit 29 is driven in order to circulate a coolant within the high frequency-sided electrode 22, and therefore, it is possible to avoid that a temperature of the semiconductor wafer 1 is increased by receiving heat of the generated plasma.

Figure 7A:
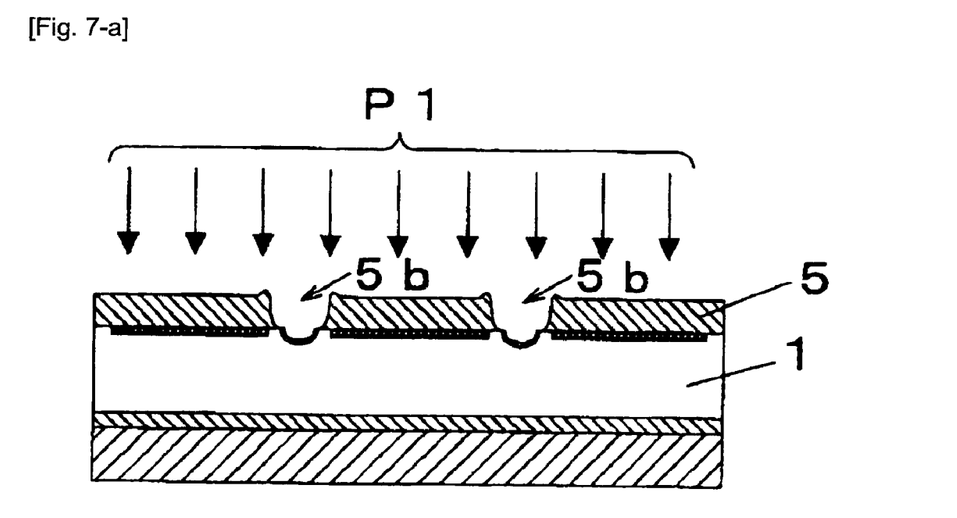
FIGS. 7(a) to 7(c) are explanatory diagrams for explaining steps of the semiconductor chip manufacturing method according to the embodiment mode of the present invention.

In other words, while the semiconductor wafer 1 obtained after the test pattern removing step ST3 is employed as the subject, such a plasma processing operation that either the oxygen gas or the oxygen mixture gas is utilized as the plasma generating-purpose gas is carried out. As a result, as shown in FIG. 7(*a*), an effect of oxygen gas plasma "P1" is given with respect to the semiconductor wafer 1 on which the opening portions 5b have been formed in the protection sheet 5, so that an isotropic etching effect caused by the oxygen gas plasma "P1" is given inside the protection sheet 5 and the opening portions 5b, and also, an ashing process is carried out by which the protection sheet 5 corresponding to an organic substance is brought into ash so as to be removed by the oxygen gas plasma P1.

Figure 8A:
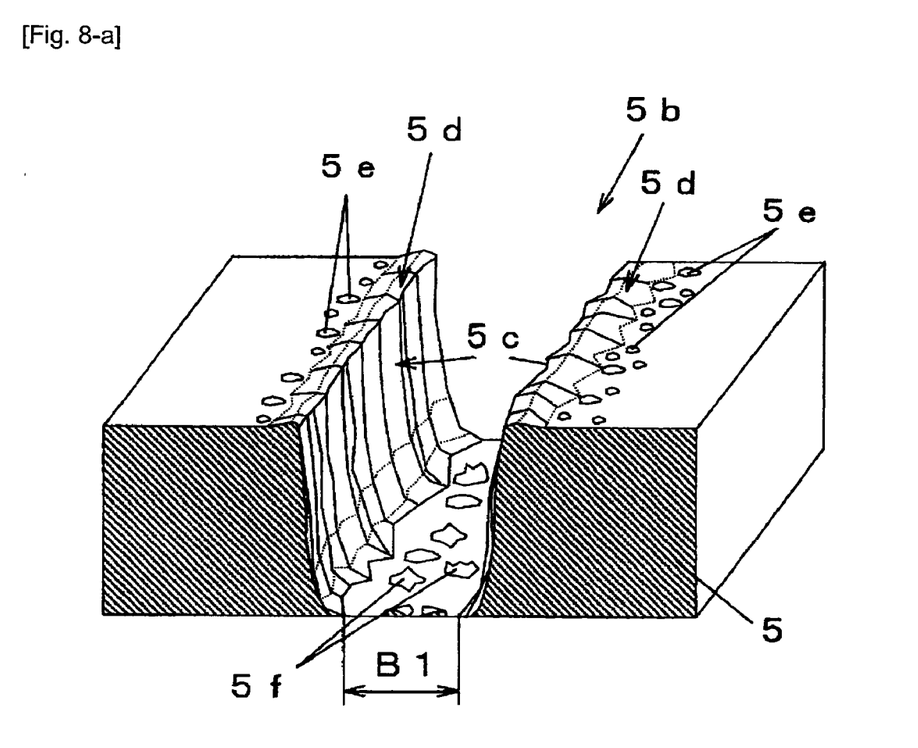
FIGS. 8(a) and 8(b) are partial sectional views for showing a semiconductor wafer in the semiconductor chip manufacturing method according to the embodiment mode of the present invention.

A detailed effect achieved by the above-described ashing process will now be described with reference to FIG. 8. FIG. 8(*a*) shows a condition of an opening portion 5b after the test pattern removing operation by the laser light has been performed. As indicated in FIG. 8(*a*) in the opening portion 5b after the laser working operation has been carried out, an inner side plane 5c is not a smoothing plane, but is brought into such a condition that concave/convex portions having very fine stripe shapes have been formed. Then, burr portions where the melted protection sheet 5 has been upwardly raised and solidified have been formed at an upper edge portion 5d of an upper edge of the opening portion 5b. Also, a portion of the opening portion 5b located in the vicinity of the upper edge portion 5d is brought into such a condition that sputters 5e have adhered. I the sputters 5e, the resin components of the protection sheet 5 which have been once melted have been solidified in very small particle shapes. In addition, remainders 5f have been present on the bottom portion of the opening portion 5b, while unremoved portions are partially left in these remainders 5f. Then, under the above-described condition, an opening width of the opening portion 5b at the bottom portion becomes "B1" which is smaller than an opening width of the protection sheet 5 on the upper plane.

Figure 8B:
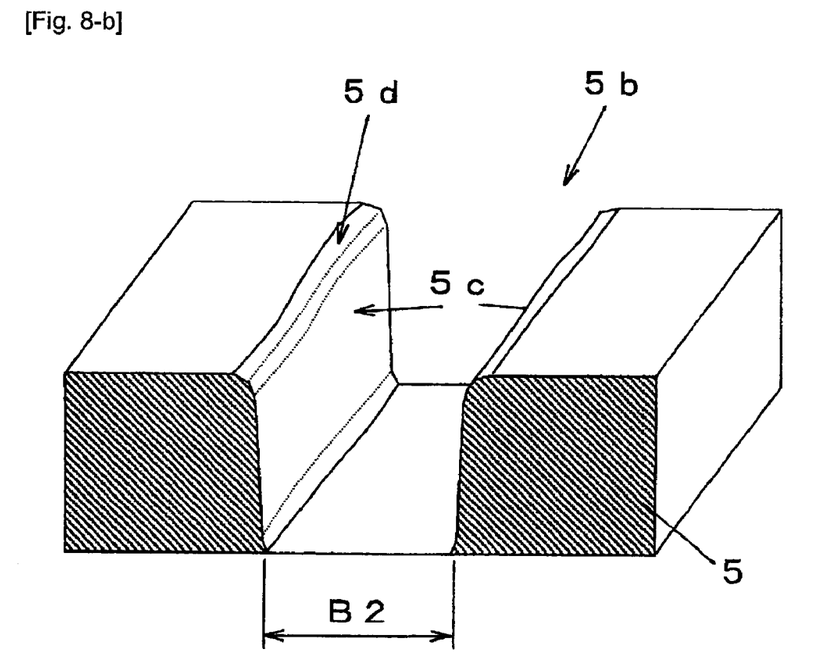

FIG. 8(*b*) represents such a condition of the opening portion 5b obtained after an ashing process has been carried out by the oxygen gas plasma "P1" with respect to the condition shown in FIG. 8(*a*). As represented in this drawing, due to the isotropic etching effect by the oxygen gas plasma "P1", the concave/convex portions are smoothed which are present on the surface of the protection sheet 5 and inner portions of the inner side plane 5c, so that the inner side plane 5c and the upper edge portion 5d may become smooth surfaces, and thus, the sputters 5e and the remainders 58 disappear. Then, the etching effect is given to the inner side plane 5c and the opening portion 5b, so that an opening width of the opening portion 5b is enlarged to become "B2" which is larger than the above-described opening width "B1" shown in FIG. 8(*a*). As a result, the below-mentioned improvement as to the damaged layer 1d may be achieved. That is, as shown in FIG. 5, such a condition that the damaged layer 1d has been partially covered by the protection sheet 5 at the both edge portions thereof (refer to arrow "a") may be changed into such a condition that the entire portion of the damaged layer 1d is exposed within the opening portion 5b (as indicated in FIG. 7(*a*)). The below-described plasma dicing process will be carried out under this condition.

Figure 7B:
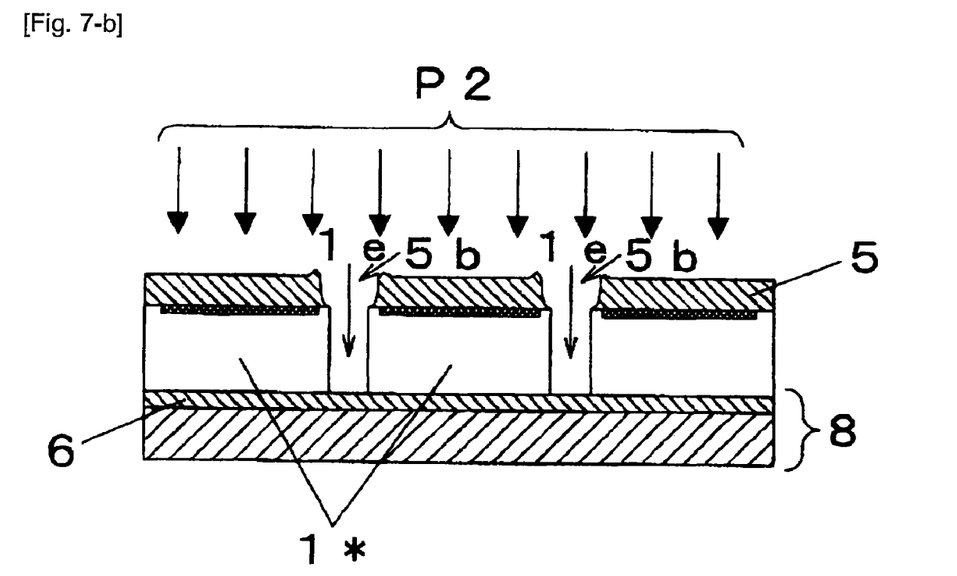

Next, the above-described plasma dicing process is carried out (step ST5). That is, plasma is generated under such a condition that since the open/close valves 25a and 25b have been operated in the plasma processing apparatus 20, the plasma generating-purpose gas of the fluorine series has been supplied from the plasma generation-purpose gas supplying unit 27b to the gas supplying hole 23a. Then, the effect of the generated fluorine gas plasma P2 is given with respect to the semiconductor wafer 1 exposed within the opening portions 5b, so that a removing width of the semiconductor wafer 1 in which silicon is the major component thereof may be removed, as indicated in FIG. 7(*b*). This removing width corresponds to the opening portion 5b.

As a result, dicing groove portions 1e which penetrate through the semiconductor wafer 1 along upper/lower direction are formed, so that the semiconductor wafer 1 is divided into individual semiconductor chips "1*". At this time, the damaged layer 1d formed in the surface of the concave portion 1c is also removed by the laser working operation due to the plasma effect. As previously described, since the damaged layer 1d has been completely exposed within the opening portions 5b, this damaged layer 1d is completely removed. As a consequence, the following problem never occurs: That is, in this problem, strengths of semiconductor chips are lowered, since such a damaged layer 1d which has not yet removed is partially left.

In other words, in the plasma dicing step ST5, after the test pattern removing step ST3 has been carried out, the removed protection sheet 5 having the predetermined width is plasma-etched in the semiconductor wafer 1, namely, the portion of the protection sheet 5 is plasma-etched, which corresponds to the boundary line region 5a. As a result, the damaged layer 1d produced by irradiating the laser light 9a in the laser working operation is removed, and furthermore, the semiconductor wafer 1 is divided into the individual semiconductor chips "1*" with respect to each of the integrated circuits 3 (plasma dicing step ST5).

Figure 7C:
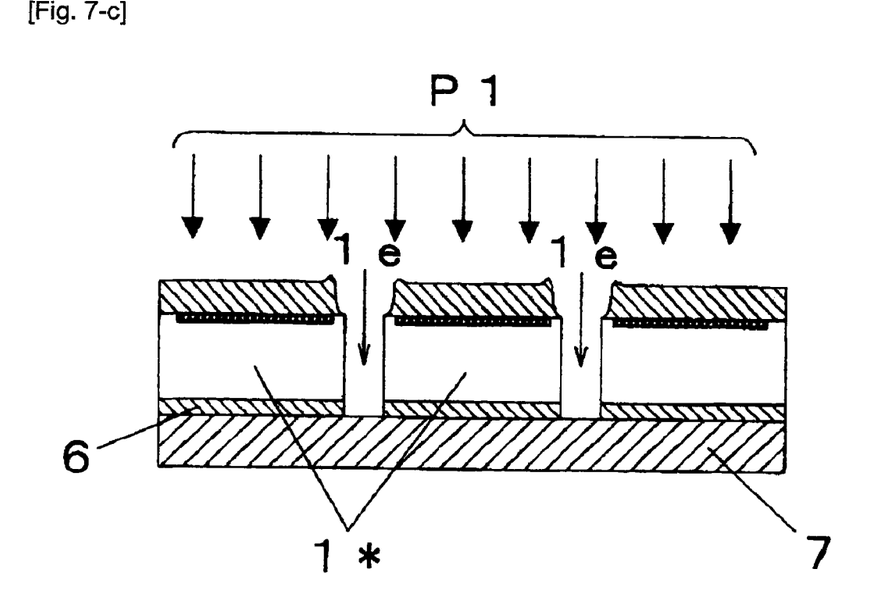

Next, a DAF plasma etching process is carried out (step ST6). In this step ST6, plasma is generated under such a condition that since the opening/closing valves 25a and 25b have been operated in the laser working apparatus 10, the supply source of the plasma generating-purpose gas has been again switched to the plasma generation-purpose gas supplying unit 27a, and thus, either an oxygen gas or an oxygen mixture gas has been supplied from the plasma generating-purpose gas supplying unit 27a to the gas supplying hole 23a. In other words, as shown in FIG. 7(c), an effect caused by oxygen gas plasma "P1" generated by supplying either the oxygen gas or the plasma generating-purpose gas of the oxygen-series gas is given to the die attach film 6 via the dicing groove portions 1e formed in the above-described plasma dicing step ST5.

As a result, the die attach film 6 which has been exposed within the dicing groove portions 1e and is an organic substance is processed by the oxygen gas plasma "P1" in the ashing process so as to be removed. In other words, the die attach film 7 is etched by employing the plasma generated by either the oxygen gas or the gas containing oxygen so as to be removed. Then, as a result, plural pieces of the above-described semiconductor chips "1*" divided by the dicing groove portions 1e are brought into such a condition that the individual semiconductor chips 1* have been held via the die attach film 6 by the resin sheet 7.

Figure 9A:
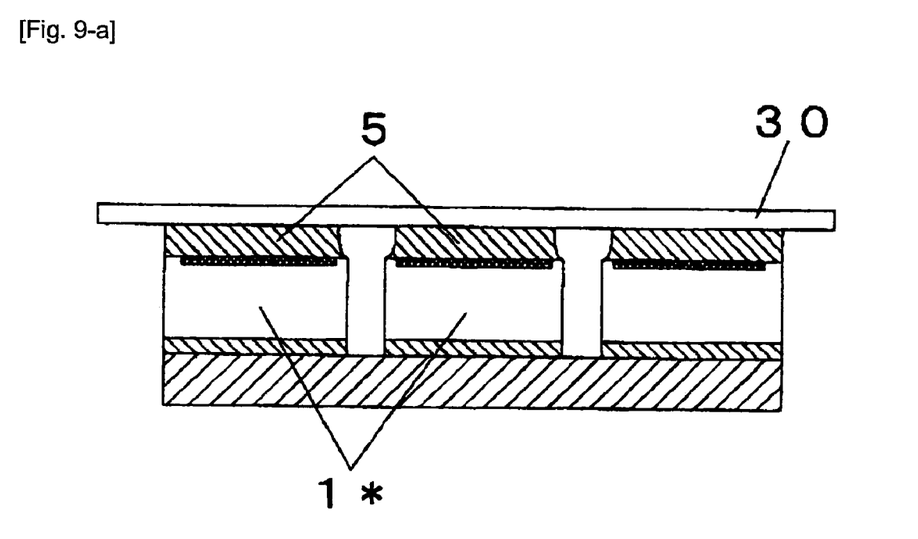
FIGS. 9(a) to 9(c) are explanatory diagrams for explaining steps of the semiconductor chip manufacturing method according to the embodiment mode of the present invention.

Subsequently, ultraviolet rays are irradiated in order to easily release the protection sheet 5 (step ST7). In this step ST7, the ultraviolet rays are irradiated from the side of the front plane 1a of the semiconductor wafer 1 with respect to the protection sheet 5 so as to lower the adhesive force which causes the protection sheet 5 to be adhered to the front plane 1a. It should also be noted that while ultraviolet rays are generated from the plasma of the fluorine-series gas in the above-described plasma dicing step ST5, if a sufficiently large amount of ultraviolet rays is generated by which the adhesive force of the protection sheet 5 may be lowered, then the above-explained ultraviolet ray irradiating step ST7 may be alternatively omitted. Thereafter, an adhesive sheet is adhered in order to release and remove the protection sheet 5 (step ST8). In other words, as shown in FIG. 9(a), a die bonding sheet 30 corresponding to an adhesive sheet is adhered from the upper plane side of the protection sheet 5 with respect to the plurality of semiconductor chips "1*" in a batch manner. It should also be understood that when such a die bonding sheet 30 is employed through which ultraviolet rays can penetrate, any of the ultraviolet ray irradiating step (ST7) and the adhesive sheet adhering step (ST8) may be performed at first.

Figure 9B:
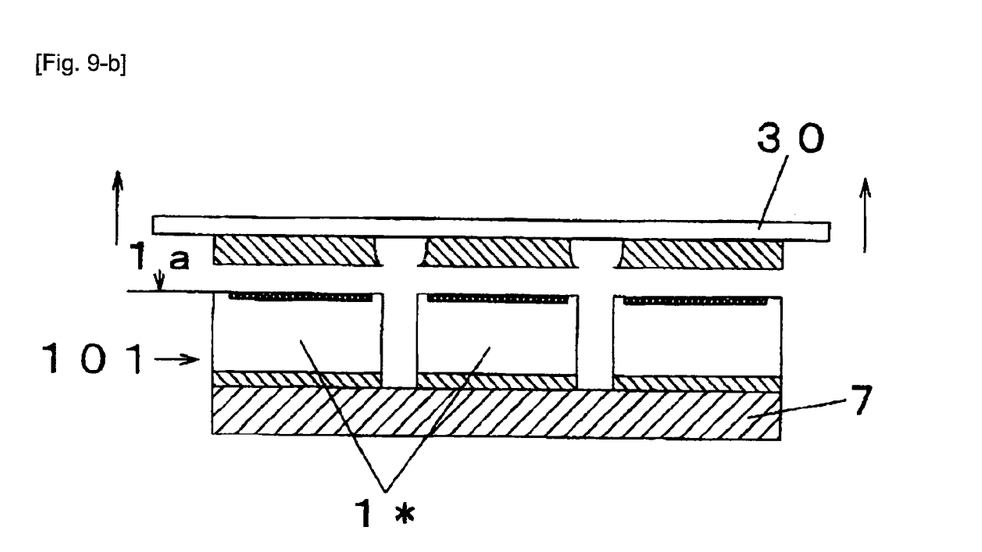

Next, a protection sheet removing operation is carried out so as to remove the protection sheet 5 from the front plane 1a (step ST9: protection sheet removing step). That is, as shown in FIG. 9(b), the die bonding sheet 30 is torn off along the upper direction, so that the protection sheet 5 is released from the upper plane 1a with respect to each of these semiconductor chips "1*." As a consequence, an assembled body 101 of the semiconductor chips "1*" may be accomplished. The assembled body 101 has such a structure that the semiconductor chips "1*" manufactured by dividing the semiconductor wafer 1 shown in FIG. 1 into the individual semiconductor chips "1*" with respect to each of the integrated circuits 3 have been held via the die attach film 6 on the resin sheet 7.

Figure 9C:
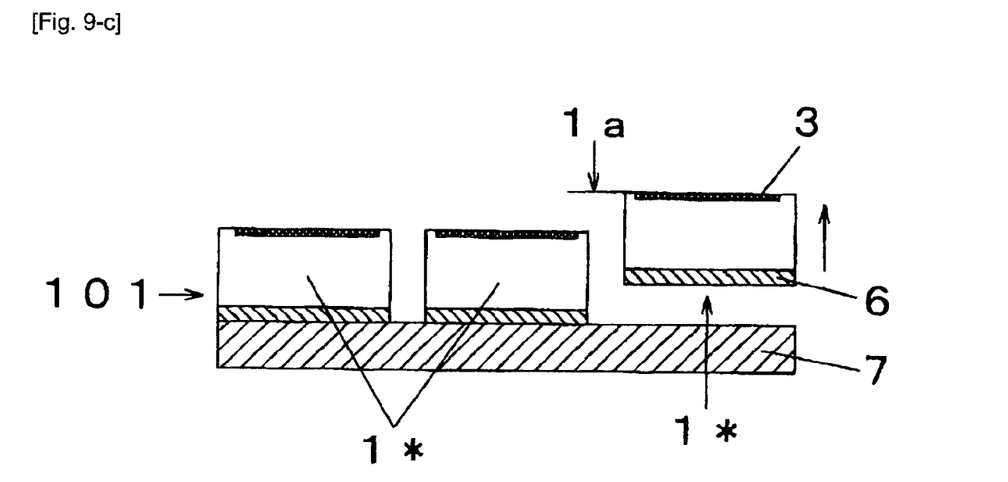

The assembled body 101 of the semiconductor chips "1*" is transported to a die bonding step under such a condition that this assembled body 101 is held by such a jig as a wafer ring, and then, as represented in FIG. 9(c), the individual semiconductor chips "1*" are sequentially derived one by one from the resin sheet 7 in the die bonding step. When the semiconductor chips "1*" are derived, since ultraviolet rays are previously irradiated from the lower plane side of the resin sheet 7 corresponding to a UV tape, the adhesive force of the resin sheet 7 for adhering the die attach film 6 is lowered, so that these semiconductor chips "1*" may be readily derived from the die attach film 6. Then, the derived semiconductor chips "1*" are bonded on a board (not shown) via the die attach film 6 corresponding to an adhesive layer.

As previously described, in the semiconductor chip manufacturing method represented in the present embodiment mode, the protection sheet 5 which constitutes the mask in the plasma etching process for the dicing process purpose is adhered onto the front plane 1a of the semiconductor wafer 1, on which the integrated circuits 3 have been formed; the laser light is irradiated from the side of the protection sheet 5 along the scribe lines 2a of the semiconductor wafer 1 on which the protection sheet 5 has been adhered, and only the predetermined widths of the protection sheet 5 on the scribe lines 2a are removed so as to form the mask; and also, the test patterns 4 are removed in combination with the front plane layer of the semiconductor wafer 1 by the above-described laser light.

As a consequence, the test patterns 4 can be removed in a higher production efficiency by the simple method at the same time when the mask for the plasma dicing process is formed. In other words, the simplification of the removing steps for the test patterns 4 can be realized, as compared with the conventionally employed various sorts of methods, for instance, the method for mechanically removing the test patterns by employing two sorts of the rotary blades in the dicing step; and the method for performing the plasma etching process from the rear side of the circuit forming plane of the semiconductor wafer so as to remove the test patterns.

Moreover, the method indicated in the present embodiment mode may also be applied to such a case that while sizes of test patterns are made large, the test patterns have been formed in such a manner that semiconductor chips located adjacent to each other on scribe lines are coupled to each other without any gap. Also, in accordance with the above-described method, such an etching process using poisonous gas such as chlorine-series gas is no longer required which has been employed in the conventional test pattern forming case, the test patterns can be removed in the plasma etching process with employment of the process gas of the fluorine-series gas. As a consequence, since the present invention is applied, the semiconductor chip manufacturing method having the superior general-purpose characteristics can be realized in the higher production efficiency by employing the simple step structures.

INDUSTRIAL APPLICABILITY

The semiconductor chip manufacturing method of the present invention has such an advantage that the test patterns can be removed in the higher efficiency in the simple steps while maintaining the general-purpose characteristics, and the above-described semiconductor chip manufacturing method may be usefully applied to such a technical field that a semiconductor wafer where a plurality of integrated circuits have been formed is divided with respect to each of the integrated circuits so as to manufacture individual semiconductor chips.

This application is based upon and claims the benefit of priority of Japanese Patent Application No. 2007-028933 filed on Feb. 8, 2008, the contents of which are incorporated herein by reference in its entirety.

The invention claimed is:

1. A semiconductor chip manufacturing method in which a semiconductor chip containing a plurality of integrated circuits formed in a plurality of regions segmented by a plurality of scribe lines and containing a plurality of test patterns formed in said scribe lines is divided by a plasma etching process so as to manufacture individual semiconductor chips with respect to each of the integrated circuits, said semiconductor chip manufacturing method is comprising:
   a sheet adhering step for adhering a protection sheet which constitutes a mask in said plasma etching process onto a front plane of said semiconductor wafer, on which said integrated circuits have been formed, and further, for adhering a holding sheet onto a rear plane of said semiconductor wafer, said holding sheet being employed so as to hold the individual semiconductor chips when under divided condition;
   a test pattern removing step in which laser light is irradiated from the side of said protection sheet along the scribe lines with respect to said semiconductor wafer on which said protection sheet has been adhered, such that only a predetermined width of said protection sheet on said scribe lines is removed so as to form said mask, and also, said test patterns are removed in combination with a front plane layer of said semiconductor wafer;
   a preliminary plasma etching process for enlarging an opening width of an opening portion of said protection sheet removed by said laser light;
   a plasma dicing step in which a portion within said semiconductor wafer is plasma-etched after said test pattern removing step, such that a damaged layer produced by irradiating the laser light is removed, and also, said semiconductor wafer is divided with respect to each of said individual integrated circuits, wherein said portion corresponds to said removed protection sheet having the predetermined width and;
   a protection sheet removing step for removing said protection sheet from the front plane of said semiconductor wafer after said plasma dicing step.

2. A semiconductor chip manufacturing method as claimed in claim 1, wherein said preliminary plasma etching process is carried out prior to said plasma dicing step.

3. A semiconductor chip manufacturing method as claimed in claim 2, wherein said protection sheet includes a resin sheet having an adhesive layer whose adhesive force is lowered by light; and said preliminary plasma etching process uses an oxygen gas, or a gas containing oxygen.

4. A semiconductor chip manufacturing method as claimed in claim 1, wherein while a resin sheet equipped with a die attach film is used as said holding sheet, said die attach film is contacted to the rear plane of said semiconductor wafer so as to adhere said holding sheet in said sheet adhering step; and, after said plasma dicing step, said die attach film between the semiconductor chips located adjacent to each other is removed by plasma produced by an oxygen gas, or plasma produced by a gas containing oxygen.

* * * * *